(12) United States Patent
Gagne et al.

(10) Patent No.: US 8,624,663 B2
(45) Date of Patent: Jan. 7, 2014

(54) METHODS AND APPARATUS RELATED TO AN IMPROVED COMPLEMENTARY MOSFET SWITCH

(75) Inventors: Nickole Gagne, Saco, ME (US); Kenneth P Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/410,932

(22) Filed: Mar. 2, 2012

(65) Prior Publication Data

US 2013/0229225 A1 Sep. 5, 2013

(51) Int. Cl.
*H03K 17/687* (2006.01)

(52) U.S. Cl.
USPC ........... 327/427; 327/108; 327/110; 327/382; 327/408; 327/536; 363/59; 363/60

(58) Field of Classification Search
USPC ......... 327/108, 109, 110, 111, 112, 427, 391, 327/437, 382, 408, 536, 170, 390, 434, 327/436; 363/59, 60

See application file for complete search history.

(56) References Cited

U.S. PATENT DOCUMENTS

| | | | |
|---|---|---|---|
| 5,808,502 A * | 9/1998 | Hui et al. | 327/333 |
| 6,292,049 B1 * | 9/2001 | Ricks et al. | 327/536 |
| 6,522,187 B1 | 2/2003 | Sousa | |
| 7,649,400 B2 * | 1/2010 | Esquivel | 327/379 |
| 7,760,007 B2 | 7/2010 | Holzmann | |
| 2008/0197898 A1 * | 8/2008 | Lin et al. | 327/157 |

* cited by examiner

*Primary Examiner* — Nguyen Tran
*Assistant Examiner* — Afework Demisse
(74) *Attorney, Agent, or Firm* — Brake Hughes Bellermann LLP

(57) ABSTRACT

In one general aspect, an apparatus can include a complementary switch circuit including a first portion and a second portion, and a first driver circuit coupled to the first portion of the complementary switch circuit. The apparatus can include a positive charge pump device coupled to the first driver, and a second driver circuit coupled to the second portion of the complementary switch circuit. The apparatus can also include a negative charge pump device coupled to the second driver circuit.

21 Claims, 9 Drawing Sheets

METHODS AND APPARATUS RELATED TO AN IMPROVED COMPLEMENTARY MOSFET SWITCH

TECHNICAL FIELD

This description relates to methods and apparatus related to an improved complementary metal-oxide-semiconductor field-effect transistor (CMOS) switch device.

BACKGROUND

Known complementary metal-oxide-semiconductor field-effect transistor (CMOS) switch devices can have an on-resistance and/or an on-capacitance that can affect the functionality of the CMOS switch devices in an undesirable fashion. For example, a CMOS switch device with a relatively high on-resistance and/or a relatively high on-capacitance can attenuate, introduce delay into, or otherwise distort a signal passing-through the CMOS switch device. The fidelity of a signal controlled at known CMOS switch devices can be compromised by an undesirable level of on-resistance and/or on-capacitance of the CMOS switch device. Thus, a need exists for systems, methods, and apparatus to address the shortfalls of present technology and to provide other new and innovative features.

SUMMARY

In one general aspect, an apparatus can include a complementary switch circuit including a first portion and a second portion, and a first driver circuit coupled to the first portion of the complementary switch circuit. The apparatus can include a positive charge pump device coupled to the first driver, and a second driver circuit coupled to the second portion of the complementary switch circuit. The apparatus can also include a negative charge pump device coupled to the second driver circuit.

In another general aspect an apparatus can include a positive charge pump device, and a negative charge pump device. The apparatus can include a transmission gate switch including an N-type metal-oxide-semiconductor field-effect transistor (MOSFET) device operatively coupled to the positive charge pump device via a first driver circuit, and a P-type MOSFET device operatively coupled to the negative charge pump via a second driver circuit.

In yet another general aspect, a method can include receiving a switch enable signal at an input terminal of a charge pump switch, and applying a positive charge pump voltage higher than a regulation voltage to a first portion of a switch circuit included in the charge pump switch in response to the receiving the switch enable signal. The method can include applying a negative charge pump voltage lower than a ground voltage to a second portion of the switch circuit included in the charge pump switch in response to the receiving the switch enable signal.

The details of one or more implementations are set forth in the accompanying drawings and the description below. Other features will be apparent from the description and drawings, and from the claims.

DETAILED DESCRIPTION

Figure 1:
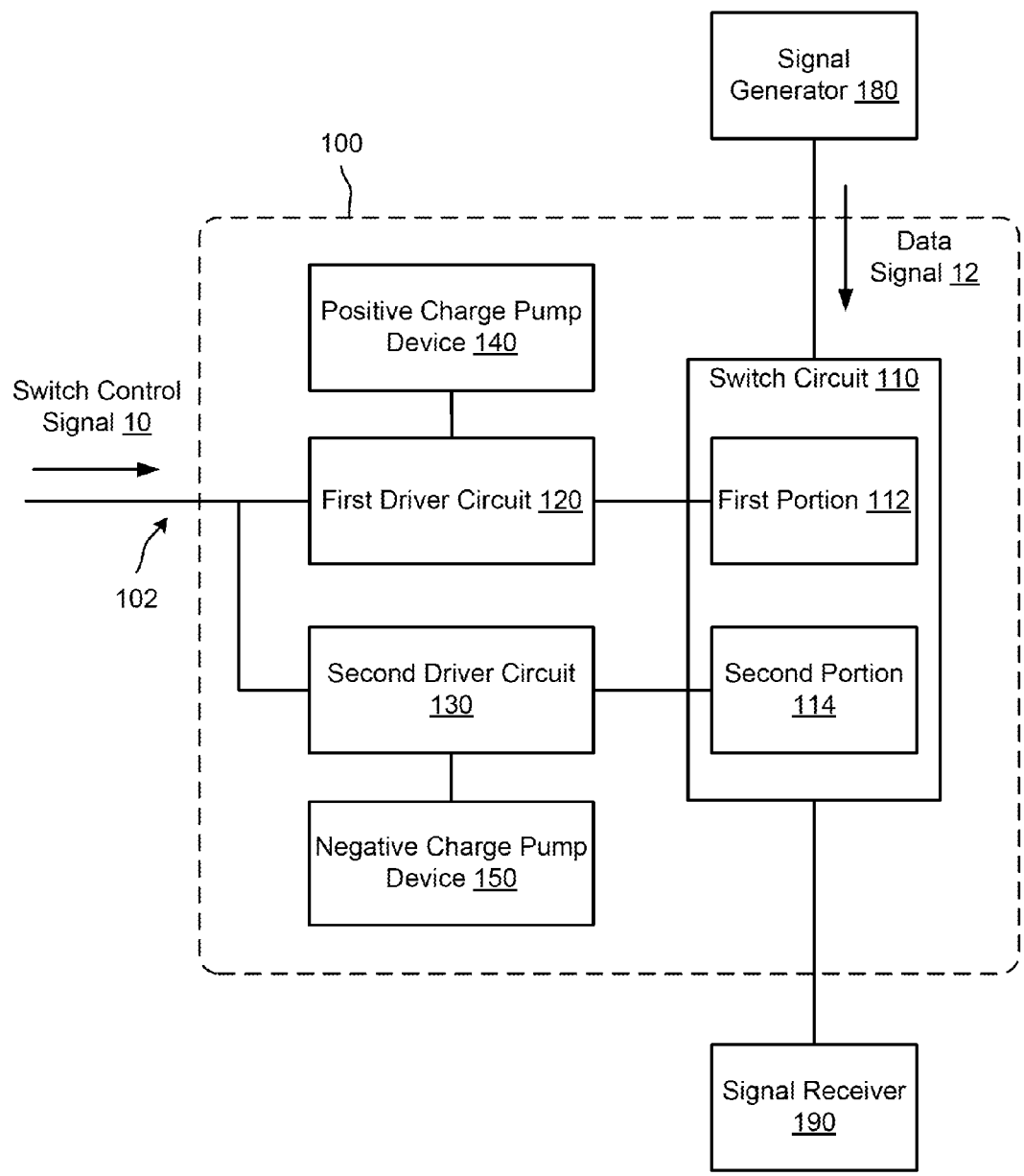
FIG. 1 is a block diagram that illustrates a charge pump switch, according to an embodiment.

FIG. 1 is a block diagram that illustrates a charge pump switch 100, according to an embodiment. As shown in FIG. 1, the charge pump switch 100 is coupled to a signal generator 180 and the charge pump switch 100 is coupled to a signal receiver 190. The charge pump switch 100 is configured so that a data signal 12 produced by the signal generator 180 can be passed through the charge pump switch 100 to the signal receiver 190 when (e.g., in response to) the charge pump switch 100 is enabled (e.g., turned on, activated, changed to an on-state or pass-through state). The charge pump switch 100 is also configured so that the data signal 12 produced by the signal generator may not be passed through the charge pump switch 100 to the signal receiver 190 when the charge pump switch 100 is disabled (e.g., turned off, high impedance, deactivated, changed to an off-state or cut-off state). In some embodiments, a portion of the data signal 12 into the charge pump switch 100 (from the signal generator 180) can be referred to as an input portion of the data signal 12 or as an input data signal, and a portion of the data signal 12 out of the charge pump switch 100 (to the signal receiver 190) (not shown) can be referred to as an output portion of the data signal 12 or as output data signal.

In this embodiment, the charge pump switch 100 can be enabled or disabled in response to a switch control signal 10. In other words, the charge pump switch 100 can be triggered to pass or cut-off a signal produced by the signal generator 180 to the signal receiver 190 in response to the switch control signal 10.

As shown in FIG. 1, the charge pump switch 100 includes a switch circuit 110 coupled to the signal generator 180 and to the signal receiver 190. The switch circuit 110 includes a first portion 112 and a second portion 114. The first portion 112 and the second portion 114 can each be configured to change between an on-state (e.g., an active state, a conducting state) and an off-state (e.g., a deactivated state, a non-conducting state) when the charge pump switch 100 is enabled and disabled, respectively. As shown in FIG. 1, the data signal 12 can be coupled to the switch circuit 110 included in the charge pump switch 100.

In some embodiments, the first portion 112 and/or the second portion 114 can include, for example, one or more metal-oxide-semiconductor field-effect transistors (MOSFETs) (e.g., vertical MOSFET device(s), lateral MOSFET device(s), an array of MOSFET devices). In some embodiments, the first portion 112 can include one or more N-type MOSFET (NMOS) devices. In some embodiments, the second portion 114 can include one or more P-type MOSFET (PMOS) devices. In some embodiments, the switch circuit 110 can include one or more inverters, logic gates, and/or so forth. In some embodiments, the switch circuit 110 (and the charge pump switch 100) can function as (e.g., can be configured to function as), for example, a pass gate or as a blocking component. Moreover, the switch circuit 110 (and the charge pump switch 100) can function as a pass gate or as a blocking component between the signal generator 180 and the signal receiver 190.

For example, in some embodiments, when the charge pump switch 100 is enabled, both the first portion 112 and the second portion 114 can both be in an on-state or activated. The first portion 112 and the second portion 114 can both be in an on-state so that the data signal 12 can be passed through the switch circuit 110 to the signal receiver 190. When the charge pump switch 100 is disabled, both the first portion 112 and the second portion 114 can both be in an off-state or deactivated. The first portion 112 and the second portion 114 can both be in an off-state so that the data signal 12 may not be passed through (e.g., may be prevented from passing through) the switch circuit 110 to the signal receiver 190.

In some embodiments, the first portion 112 can be referred to as a low common mode portion, and in some embodiments, the second portion 114 can be referred to as a high common mode portion. In some embodiments, the first portion 112 can be referred to as the low common mode portion because the first portion 112 can have a relatively low impedance when a relatively low common mode voltage is passed through the first portion 112, and the second portion 114 can be referred to as a high common mode portion can have a relatively low impedance when a relatively high common mode voltage is passed through the second portion 114. In some embodiments, the switch circuit 110 can be referred to as a complementary switch circuit or as a pass-gate circuit. In particular, switch circuit 110 can be referred to as a complementary switch circuit when including complementary MOSFET devices (e.g., an NMOS device and a PMOS device).

As shown in FIG. 1, the first portion 112 is coupled to (e.g., operatively coupled to) a first driver circuit 120, and the second portion 114 is coupled to (e.g., operatively coupled to) a second driver circuit 130. In some embodiments, the first driver circuit 120 and the second driver circuit 130 can collectively be referred to as driver circuits 120, 130. The first driver circuit 120 can be configured to trigger (e.g., drive) the first portion 112 to change (e.g., switch) between an on-state and an off-state in response to the switch control signal 10 into an input terminal 102 of the charge pump switch 100. Similarly, the second driver circuit 130 can be configured to trigger the second portion 114 to change between an on-state and an off-state in response to the switch control signal 10. In some embodiments, the first driver circuit 120 and/or the second driver circuit 130 can include one or more inverters, logic gates, and/or so forth. In some embodiments, the first drive circuit 120 can be referred to as a first driver circuit, and the second driver circuit 130 can be referred to as a second driver circuit (and vice versa).

As shown in FIG. 1, the first driver circuit 120 is coupled to (e.g., operatively coupled to) a positive charge pump device 140, and the second driver circuit 130 is coupled to (e.g., operatively coupled to) a negative charge pump device 150. The positive charge pump device 140 and the negative charge pump device 150 can collectively be referred to as charge pump devices 140, 150. Accordingly, the charge pump switch 100 includes multiple charge pump devices that can be used to drive different portions of the switch circuit 110. In some embodiments, because the charge pump switch 100 includes multiple charge pump devices, the charge pump switch 100 can be referred to as a multi-charge pump switch (e.g., a dual-charge pump switch).

The positive charge pump device 140 can be configured to generate and apply power (e.g., a voltage, a current) to the first driver circuit 120 that can be used by the first driver circuit 120 to trigger (e.g., drive) the first portion 112 of the switch circuit 110. Similarly, the negative charge pump device 150 can be configured to generate and apply power to the pull-down driver circuit 130 that can be used by the second driver circuit 130 to trigger (e.g., drive) the second portion 114 of the switch circuit 110.

The positive charge pump device 140 and the negative charge pump device 150 can be configured to apply power (e.g., voltages, currents) that can increase the drive implemented, respectively, by the first driver circuit 120 and the second driver circuit 130 beyond what might otherwise be possible without the charge pump devices 140, 150. The charge pump devices 140, 150 can be configured to provide power that is higher or lower than might be otherwise available to the driver circuits 120, 130. Specifically, the positive charge pump device 140 can be configured to provide a positive charge pump voltage that is higher than, for example, a regulation voltage and/or a battery voltage. Accordingly, the positive charge pump device 140 can be configured to apply power that can increase the effective overdrive voltage implemented by the first driver circuit 120 to the first portion 112 of the switch circuit 110 beyond what might otherwise be possible with the regulation voltage or the battery voltage. Similarly, the negative charge pump device 150 can be configured to provide a negative charge pump voltage that is lower than, for example, a ground voltage. Accordingly, the negative charge pump device 150 can be configured to apply power that can increase the effective overdrive voltage implemented by the second driver circuit 130 to the second portion 114 of the switch circuit 110 beyond what might otherwise be possible with the ground voltage or another voltage.

For example, the positive charge pump device 140 can be configured to provide a positive charge pump voltage via the first driver circuit 120 to the first portion 112 that is higher than a regulation voltage available within a computing device including the charge pump switch 100. Accordingly, the first driver circuit 120 can be configured to drive the first portion 112 using the positive charge pump voltage provided by the positive charge pump device 140 to a desirable on-state that can have, for example, a relatively low on-resistance (RON) and/or a relatively low on-capacitance (CON). Specifically, the positive charge pump voltage provided by the positive charge pump device 140 can drive the first portion 112 to an on-state that has, for example, an on-resistance and/or an on-capacitance that is lower than an on-resistance and/or an on-capacitance of an on-state that may be triggered using a regulation voltage (lower than the positive charge pump voltage). Similarly, a negative charge pump voltage provided by the negative charge pump device 150 can drive the second portion 114 to an on-state that has, for example, and on-resistance and/or an on-capacitance that is lower than an on-resistance and/or an on-capacitance of an on-state that may be triggered using a ground voltage (higher than the negative charge pump voltage).

In some embodiments, the charge pump switch 100 shown in FIG. 1 can be used in a variety of applications including data connectivity applications. In some embodiments, the charge pump switch 100 can be included in one or more terminals (e.g., data ports, data connectors) configured to receive the data signal 12, one or more terminals configured to transmit the data signal 12 to another computing device. In some embodiments, the signal generator 180 and/or the signal receiver 190 can be included in, or can function as, a data source such as a mobile phone, a computing device, a hard drive, a network device, a universal serial bus (USB) connected computing device, an audio/video device (e.g., music storage device, web camera, video recorder), and/or so forth, configured to produce and/or receive the data signal 12.

In some embodiments, the data signal 12 can be, for example, a video signal, an audio signal, a control signal, and/or so forth. In some embodiments, the data signal 12 can be a differential signal, a high-frequency signal, a low-frequency signal, a multiplexed signal, an analog signal, a digital signal, and/or so forth. In some embodiments, the data signal 12 can be based on one or more protocols, codecs, and/or so forth. In some embodiments, the data signal 12 can be, for example, a USB signal (e.g., a USB 2.0 signal, a USB 3.0 signal), an audio signal, a video signal, a universal asynchronous receiver/transmitter (UART) signal, a mobile HD link (MHL) signal, and/or so forth.

Because the on-resistance and/or on-capacitance of the switch circuit 110 can be relatively low (when the switch circuit 110 is activated or in an on-state), the integrity of one or more signals passing through the switch circuit 110 can be maintained. In some embodiments, a signal passing through the switch circuit 110 can have a frequency that is higher than would be possible if the charge pump switch 100 did not include both the positive charge pump device 140 and the negative charge pump device 150. Also, a signal passing through the switch circuit 110 can have a bandwidth that is higher than would be possible if the charge pump switch 100 did not include both the positive charge pump device 140 and the negative charge pump device 150.

In some embodiments, the charge pump switch 100, the signal generator 180, and/or the signal receiver 190 can be included in a variety of computing devices such as a wired device and/or a wireless device (e.g., wi-fi enabled device) and can be, for example, a computing entity (e.g., a personal computing device), a server device (e.g., a web server), a mobile phone, a touchscreen device, a personal digital assistant (PDA), a laptop, a television including, or associated with, one or more processors, a tablet device, e-reader, and/or so forth. The computing device(s) can be configured to operate based on one or more platforms (e.g., one or more similar or different platforms) that can include one or more types of hardware, software, firmware, operating systems, runtime libraries, and/or so forth.

In some embodiments, the charge pump switch 100 can be configured to function as a transmission gate switch for, for example, one or more computing devices. In some embodiments, the charge pump switch 100 can be, for example, included in a mobile switch link, high definition link, and/or so forth. In some embodiments, the charge pump switch 100 can be included in one or more data conductivity applications, data communication applications, load switch applications, and/or so forth.

Figure 2:
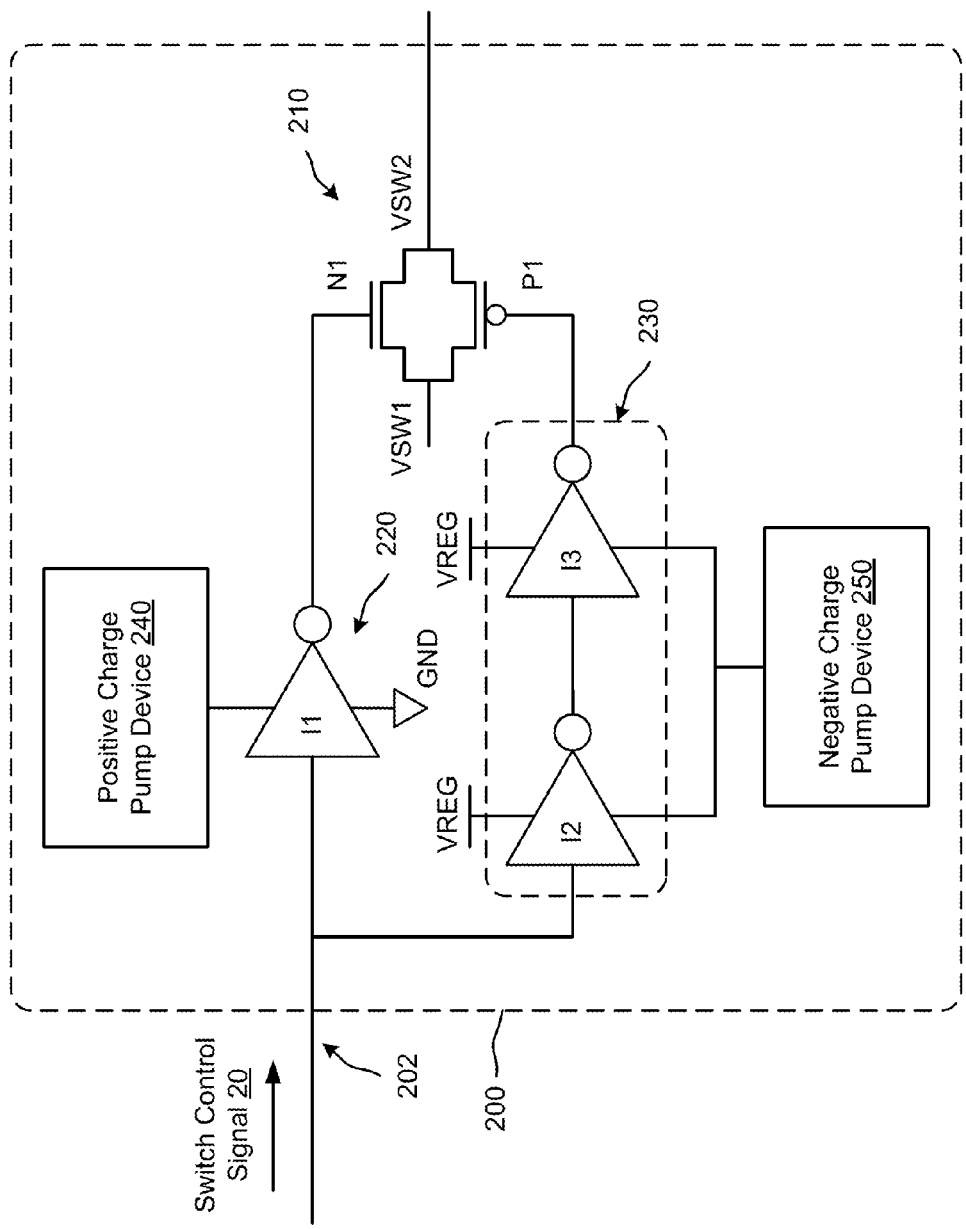
FIG. 2 is a schematic diagram that illustrates an implementation of a charge pump switch, according to an embodiment.

FIG. 2 is a schematic diagram that illustrates an implementation of a charge pump switch 200, according to an embodiment. In some embodiments, the charge pump switch 200 can be an implementation of the charge pump switch 100 shown in FIG. 1.

As shown in FIG. 2, the charge pump switch 200 includes a positive charge pump device 240 coupled to (e.g., operatively coupled to) an inverter I1 functioning as a first driver circuit 220 for an NMOS device N1 included in a switch circuit 210. The charge pump switch 200 also includes a negative charge pump device 250 coupled to (e.g., operatively coupled to) inverter I2 and inverter I3, which are collectively functioning as a second driver circuit 230 for a PMOS device P1 included in the switch circuit 210. As shown in FIG. 2, the NMOS device N1 and the PMOS device P1 of the switch circuit 210 collectively define a complementary MOSFET (CMOS) device. In some embodiments, the positive charge pump device 240 and the negative charge pump device 250 can collectively be referred to as charge pump devices 240, 250. The first driver circuit 220 and/or the second driver circuit 230 can be configured to drive the switch circuit 210 and can be configured to provide an appropriate logical signal level to drive the switch circuit 210.

As shown in FIG. 2, an input signal (e.g., an input data signal) VSW1 is received on one side of the switch circuit 210. An output signal (e.g., an output data signal) VSW2 is received on another (e.g., an opposite) side of the switch circuit 210. When the switch circuit 210 is in an on-state (e.g., when the NMOS device N1 and the PMOS device P1 are both on), the input signal VSW1 can be passed through (e.g., transmitted through) the switch circuit 210 and sent from the switch circuit 210 as output signal VSW2. When the switch circuit 210 is in an off-state (e.g., when the NMOS device N1 and the PMOS device P1 are both off), the input signal VSW1 may not be passed through (e.g., may be prevented from passing through or being transmitted through) the switch circuit 210.

The inverter I1 (which functions as the first driver circuit 220), as shown in FIG. 2, is coupled to (e.g., coupled at a low side to) a ground voltage GND. The inverter I1 is also coupled to (e.g., coupled at a high side to) the positive charge pump device 240, which is configured to produce a positive charge pump voltage. Accordingly, in response to receiving a high input value, the inverter I1 is configured to produce a low output value corresponding with the ground voltage GND. In response to receiving a low input value, the inverter I1 is configured to produce (e.g., generate) a high output value corresponding with the positive charge pump voltage produced by the positive charge pump device 240.

The inverters I2 and I3 (which collectively function as the second driver circuit 230), as shown in FIG. 2, are coupled to (e.g., coupled at a high side to) a regulation voltage VREG. The inverters I2 and I3 are also coupled to (e.g., coupled at a low side to) the negative charge pump device 240, which is configured to produce a negative charge pump voltage. Accordingly, in response to receiving a high input value at inverter I2, the inverter I3 is configured to produce a high output value corresponding with the regulation voltage VREG. In response to receiving a low input value at the inverter I2, the inverter I3 is configured to produce (e.g., generate) a low output value corresponding with the negative charge pump voltage produced by the negative charge pump device 250. In some embodiments, the regulation voltage VREG can be used at the second driver circuit 230 instead of a higher voltage (e.g., the positive charge pump voltage, a battery voltage) so that the PMOS device P1, if configured as a relatively low voltage device, may not be damaged, for example, due to voltage swing, when the PMOS device P1 is maintained in an off-state, and/or so forth.

The charge pump switch 200 is configured to receive a switch control signal 20 at an input terminal 202 of the charge pump switch 200. In this embodiment, the charge pump switch 200 is configured so that the switch circuit 210 is changed to an on-state in response to the switch control signal 20 being an enable signal (as a low enable). When the switch control signal 20 has a low value, the inverter I1 produces a high value output that is at the positive charge pump voltage produced by the positive charge pump device 240. The high value output (or positive charge pump voltage) can turn on (e.g., activate) the NMOS device N1. Also, when the switch control signal 20 has a low value, the inverter I3 produces a low value output that is at the negative charge pump voltage produced by the negative charge pump device 250. The low value output (or negative charge pump voltage) can turn on (e.g., activate) the PMOS device P1.

The charge pump switch 200 is also configured so that the switch circuit 210 is changed to an off-state in response to the switch control signal 20 being a disable signal (as a high disable). When the switch control signal 20 has a high value, the inverter I1 produces a low value output that is at the ground voltage GND. The low value output (or ground voltage GND) can turn off (e.g., deactivate) the NMOS device N1. Also, when the switch control signal 20 has a high value, the inverter I3 produces a high value output that is at the regulation voltage VREG. The high value output (or regulation voltage VREG) can turn off (e.g., deactivate) the PMOS device P1.

The charge pump devices 240, 250 can be configured to produce charge pump voltages based on the characteristics of components (e.g., driver circuits 220, 230, switch circuit 210) included in the charge pump switch 200. For example, the positive charge pump device 240 can be configured to produce a positive charge pump voltage that drives the NMOS device N1 to a desirable on-state (via the first driver circuit 220) without causing undesirable consequences such as damage to the NMOS device N1. Similarly, the negative charge pump device 250 can be configured to produce a negative charge pump voltage that drives the PMOS device P1 to a desirable on-state (via the second driver circuit 230) without causing undesirable consequences such as damage to the PMOS device P1.

As a specific example, the NMOS device N1 can have a breakdown voltage rating of approximately 8 V and the input signal VSW1 received at the switch circuit 210 can have a voltage range (e.g., a voltage swing including a low-voltage limit and a high-voltage limit) of approximately −2 V to 2 V (at a common mode voltage of 0 V). The positive charge pump device 240 can be configured to produce a positive charge pump voltage less than 6 V so that the difference between the low voltage limit of the voltage range of the input signal VSW1 of −2 V and the positive charge pump voltage will not exceed the breakdown voltage rating of approximately 8 V of the NMOS device N1. Accordingly, the positive charge pump device 240 can be configured to produce a positive charge pump voltage based on the voltage range of the input signal VSW1 (and/or the output voltage signal VSW2). In some embodiments, the charge pump devices 240, 250 can be configured so that a breakdown voltage rating (e.g., a gate-to-source voltage (Vgs) rating) of the NMOS device N1 and/or the PMOS device P1 may not be exceeded.

As another example, the PMOS device P1 can have a breakdown voltage rating and the input signal VSW1 received at the switch circuit 210 can have a voltage range. The negative charge pump device 250 can be configured to produce a specified maximum or minimum negative charge pump voltage so that the difference between the high voltage limit of the voltage range of the input signal VSW1 and the negative charge pump voltage will not exceed the breakdown voltage rating of the PMOS device P1. Accordingly, the negative charge pump device 250 can be configured to produce a negative charge pump voltage based on the voltage range of the input signal VSW1 (and/or the output voltage signal VSW2). Similarly, the positive charge pump device 240 can be configured to produce a specified maximum or minimum positive charge pump voltage so that the difference between the high voltage limit of the voltage range of the input signal VSW1 and the negative charge pump voltage will not exceed a breakdown voltage rating of the NMOS device N1.

As another example, the charge pump devices 240, 250 can be configured to produce charge pump currents less than a current rating (e.g., a gate current rating) of one or more portions of the switch circuit 210. In some embodiments, the charge pump devices 240, 250 can be configured to produce charge pump voltages and/or currents less than a current and/or voltage rating of one or more of the driver circuits 220, 230.

In some embodiments, the charge pump devices 240, 250 can be configured to produce charge pump voltages and/or currents so that the one or more of the components (e.g., the PMOS device P1, the NMOS device N1) of the switch circuit 210 can have one or more target characteristics. For example, the charge pump devices 240, 250 can be configured to produce charge pump voltages and/or currents so that the one or more of the components (e.g., the PMOS device P1, the NMOS device N1) of the switch circuit 210 have a desirable on-state characteristics (e.g., on-resistance, on-capacitance) and/or off-state characteristics. For example, the on-resistance and/or on-capacitance of the switch circuit 210 can be configured, based on the charge pump voltage produced by the charge pump devices 240, 250 so that a specified bandwidth, signal integrity, distortion level, and/or so forth of a signal passing through the switch circuit 210 can be achieved.

Although not shown in FIG. 2, in some embodiments, the driver circuits 220, 230 and/or the charge pump circuits 240, 250 can include components such as bipolar junction transistor (BJT) devices, MOSFET devices, diodes, capacitors, and/or so forth. In some embodiments, one or more of the driver circuits 220, 230 can include different, more, or less combinational logic (e.g., inverters, logic gates (e.g., NAND gates, NOR gates, AND gates, OR gates, etc.)) than shown in FIG. 2. As a specific example, the driver circuit 220 can include an additional combinational logic and the driver circuit 230 can include less combinational logic so that the switch circuit 210 is changed to an on-state in response to the switch control signal 20 being an enable signal with a high value rather than enable signal with a low value.

In this embodiment, the switch circuit 210 includes a single NMOS device and a single PMOS device. In some embodiments, the NMOS device N1 and/or the PMOS device P1 can be isolated devices. In some embodiments, the NMOS device N1 and/or the PMOS device P1 can be a vertical MOSFET device or a lateral MOSFET device. In some embodiments, the NMOS device N1 can represent an array of NMOS devices, and/or the PMOS device P1 can represent an array of PMOS devices. In some embodiments, the NMOS device N1 and the PMOS device P1 can be fabricated within the same (or common) semiconductor die. In some embodiments, the NMOS device N1 and the PMOS device P1 can be discrete components fabricated in different semiconductor die. In some embodiments, the switch circuit 210 can include multiple devices such as MOSFET devices, BJT devices, diodes, capacitors, and/or so forth. In some embodiments, the PMOS device P1 can be configured to provide desirable signal passing characteristics (such as a desirable on-resistance flatness at relatively high common mode signal voltage ranges) that may not be achieved using N-type MOSFET devices (e.g., NMOS device N1) alone. In some embodiments, the NMOS device N1 can be configured to provide desirable signal passing characteristics (such as a desirable on-resistance flatness at relatively low common mode signal voltage ranges) that may not be achieved using P-type MOSFET devices (e.g., PMOS device P1) alone.

FIGS. 3A through 3F are graphs that illustrate operation of a charge pump switch. The charge pump switch can be similar to the charge pump switch 200 shown in FIG. 2. In these graphs, time is increasing to the right.

Figure 3A:
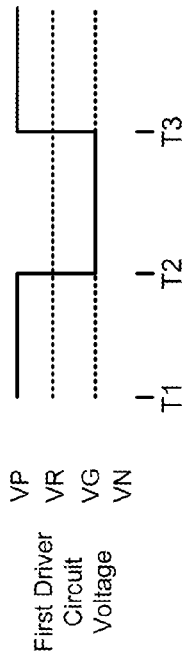
FIGS. 3A through 3F are graphs that illustrate operation of a charge pump switch.

As shown in FIG. 3A, the switch control signal is configured to produce an enable signal (which has a low value) between approximately time T1 and time T2. The switch control signal is changed from the enable signal to a disable signal (which has a high value) at approximately time T2 until approximately time T3. At approximately time T3, the enable signal changes to a disable signal.

Figure 3B:
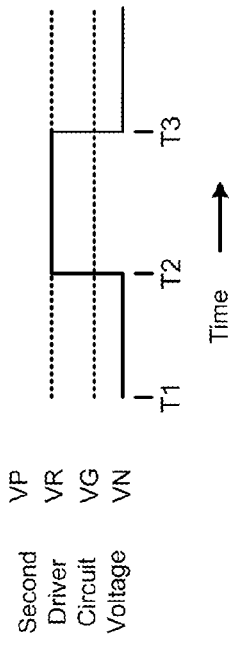
Figure 3C:
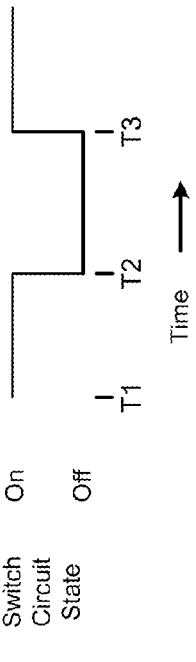
Figure 3D:
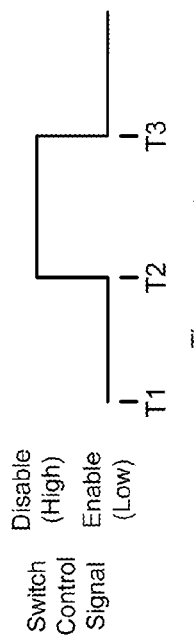
Figure 3E:
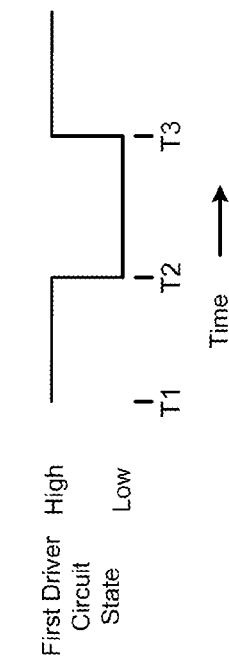
Figure 3F:
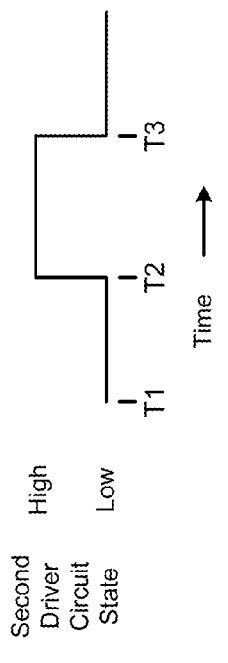

In response to the enable signal between approximately times T1 and T2 and after approximately time T3, the switch circuit state (e.g., the state of the switch circuit 210 shown in FIG. 2), as shown in FIG. 3F, is an on-state (e.g., activated). As shown in FIG. 3F, in response to the disable signal between approximately times T2 and T3, the switch circuit state is in an off-state (e.g., deactivated).

As shown in FIG. 3B, when the switch control signal is enabled (between approximately times T1 and T2 and after approximately time T3), a state of a first driver circuit (e.g., the first driver circuit 220 shown in FIG. 2) is high, and a state of a second driver circuit (e.g., the second driver circuit 230 shown in FIG. 2) is low as shown in FIG. 3C. When the switch control signal is disabled (between approximately times T2 and T3), the first driver circuit state is low (shown in FIG. 3B), and the second driver circuit state is high (shown in FIG. 3C).

As shown in FIG. 3D, the first driver circuit voltage provided by the first driver circuit is at positive charge pump voltage VP (between approximately times T1 and T2 and after approximately time T3) when the first driver circuit state is high (shown in FIG. 3B). The positive charge pump voltage VP can be from a positive charge pump device such as the positive charge pump device 240 shown in FIG. 2. The first driver circuit voltage provided by the first driver circuit falls to at a ground voltage VG (between approximately times T2 and T3) when the first driver circuit state is low (shown in FIG. 3B).

As shown in FIG. 3E, the second driver circuit voltage provided by the second driver circuit is at negative charge pump voltage VN (between approximately times T1 and T2 and after approximately time T3) when the second driver circuit state is low (shown in FIG. 3C). The negative charge pump voltage VN can be provided by a negative charge pump device such as the negative charge pump device 250 shown in FIG. 2. The second driver circuit voltage provided by the second driver circuit rises to a regulation voltage VR (between approximately times T2 and T3) when the second driver circuit state is high (shown in FIG. 3C).

As illustrated in FIGS. 3D and 3E, the voltage ranges provided by the first driver circuit and provided by the second driver circuit are offset from or overlapping one another. In this embodiment, the voltage range provided by the first driver circuit is higher than (but overlapping with) the voltage range provided by the second driver circuit. Specifically, the first driver circuit is configured to provide the positive charge pump voltage VP, which is higher than the highest voltage (i.e., the regulation voltage VR) provided by the second driver circuit. The first driver circuit is configured to provide the ground voltage VG, which is higher than the lowest voltage (i.e., the negative charge pump voltage VN) provided by the second driver circuit. The same can be said from the perspective of the second driver circuit. Specifically, the second driver circuit is configured to provide the negative charge pump voltage VN, which is lower than the lowest voltage (i.e., the ground voltage VG) provided by the first driver circuit. The second driver circuit is configured to provide the regulation voltage VR, which is lower than the highest voltage (i.e., the positive charge pump voltage VP) provided by the first driver circuit.

As illustrated in FIGS. 3D and 3E, the charge pump devices are configured to provide the charge pump voltages simultaneously or during the overlapping time periods. Specifically, the first driver circuit (as shown in FIG. 3D) is configured to provide the positive charge pump voltage VP (from a positive charge pump device) while the second driver circuit is shown in FIG. 3E) is configured to provide the negative charge pump voltage VN (from a negative charge device). However, the change in potential between the different driver circuits is in opposite directions. Specifically, the first driver circuit voltage (as shown in FIG. 3D) drops at approximately time T2 while the second driver circuit voltage (as shown in FIG. 3E) rises at approximately time T2.

In some embodiments, the voltages illustrated in FIG. 3D and FIG. 3E can vary between −10 V and +10 V. As discussed above, the voltages illustrated in FIG. 3D and FIG. 3E can be based on the voltage ratings of the devices in the charge pump switch, the voltages available within the computing device including the charge pump switch, the voltage of signals into the charge pump switch, and so forth.

For example, the positive charge pump voltage VP can be approximately 5 volts, the regulation voltage VR can be approximately 3 V, the ground voltage VG can be approximately 0 V, and the negative charge pump voltage VN can be approximately −3 V. In some embodiments, the positive charge pump voltage VP can have a magnitude more than 1.5 times (e.g., more than 2 times) a magnitude of the regulation voltage VR. In some embodiments, a battery voltage of a system including a charge pump switch (such as charge pump switch 200) can have a voltage greater than the positive charge pump voltage VP (e.g., a voltage of 4.5 V), between the positive charge pump voltage VP and the regulation voltage VR, or below the regulation voltage VR. In some embodiments, the difference between the positive charge of voltage VP and the regulation voltage VR can be greater than, equal to, or less than the difference between the negative charge pump voltage VN and the ground voltage VG.

Figure 4:
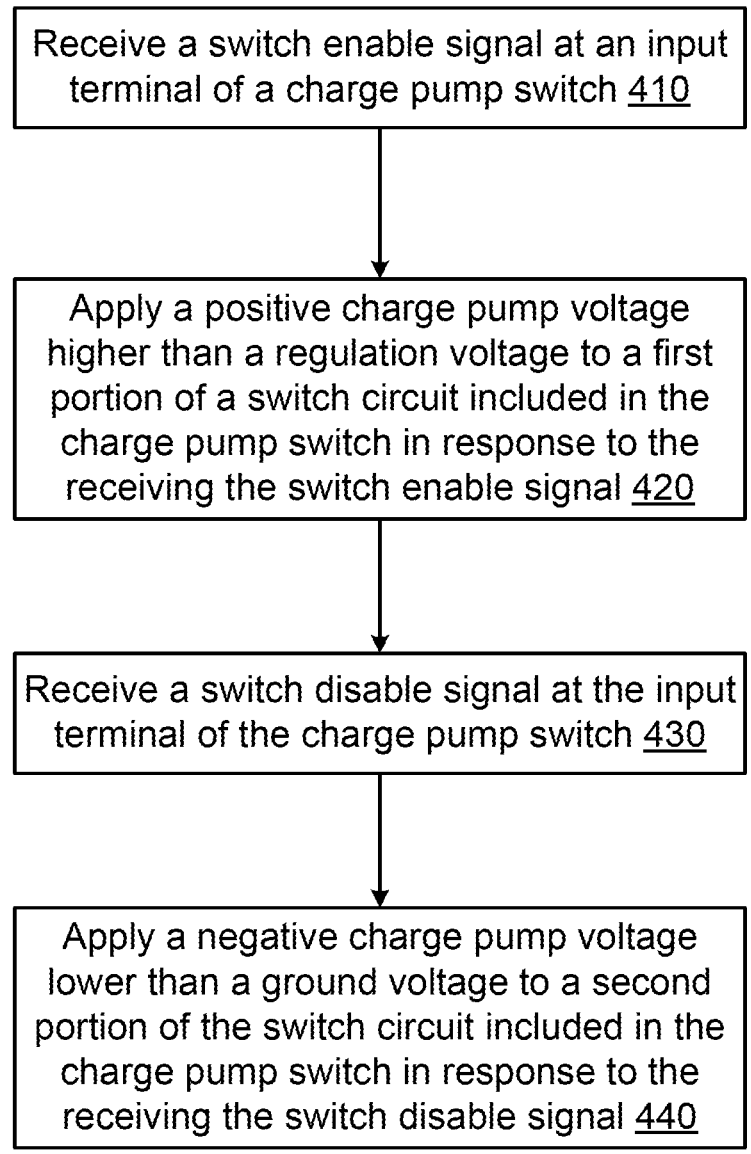
FIG. 4 is a flowchart that illustrates a method of operation of a charge pump switch, according to an embodiment.

FIG. 4 is a flowchart that illustrates a method of operation of a charge pump switch, according to an embodiment. In some embodiments, the charge pump switch can be, for example, charge pump switch 100 shown in FIG. 1, charge pump switch 200 shown in FIG. 2, and/so forth.

A switch enable signal is received at an input terminal of a charge pump switch (block 410). The switch enable signal can be received at, for example, the input terminal 102 of the charge pump switch 100 shown in FIG. 1. In some embodiments, if the charge pump switch is included in a computing device, the switch enable signal can be produced by one or more processors included in the computing device. As a specific example, if the charge pump switch is included in, or associated with, a connector or port related to a communication device, the switch enable signal can be produced in response to another device being coupled to (and/or transmitting a signal through) the connector or port.

A positive charge pump voltage higher than a regulation voltage is applied to a first portion of a switch circuit included in the charge pump switch in response to the receiving the switch enable signal (block 420). The positive charge pump voltage can be produced by, for example, the positive charge pump device 140 shown in FIG. 1.

A negative charge pump voltage lower than a ground voltage is applied to a second portion of the switch circuit included in the charge pump switch in response to the receiving the switch enable signal (block 430). The negative charge pump voltage can be produced by, for example, the negative charge pump device 150 shown in FIG. 1.

In some embodiments, a switch disable signal can be received at the input terminal of the charge pump switch. In some embodiments, the switch disable signal can be received during a different time period (e.g., during a mutually exclusive time period) than the switch enable signal. The switch disable signal can be received at, for example, the input terminal 102 of the charge pump switch 100 shown in FIG. 1. In some embodiments, if the charge pump switch is included in a connector or port related to a communication device, the switch disable signal can be produced in response to another device being decoupled from the connector or port, or in response to another device being deactivated. In some embodiments, the regulation voltage can be applied to the second portion of the switch circuit in response to the receiving the switch disable signal. In some embodiments, the ground voltage can be applied to the first portion of the switch circuit in response to the receiving the switch disable signal.

Figure 5:
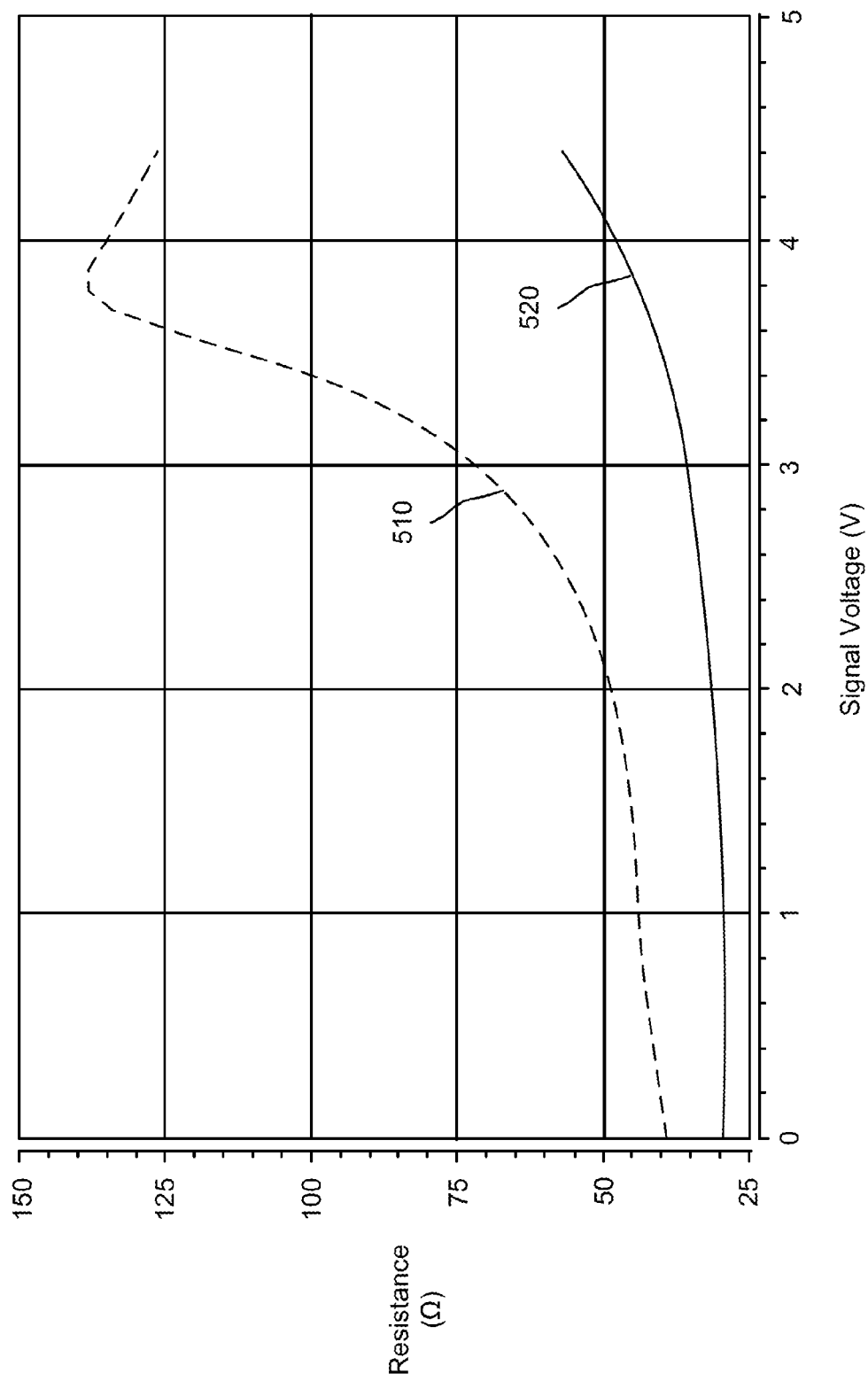
FIG. 5 is a graph that illustrates an on-resistance for a charge pump switch including multiple charge pump devices and a complementary metal-oxide-semiconductor field-effect transistor (CMOS) switch circuit.

FIG. 5 is a graph that illustrates an on-resistance 520 for a charge pump switch including multiple charge pump devices and a CMOS switch circuit. The charge pump switch can be the charge pump switch 200 shown in FIG. 2, and the CMOS switch circuit can be the switch circuit 210 shown in FIG. 2. As shown in FIG. 5, the on-resistance 520 of the charge pump switch is illustrated with resistance in ohms ($\Omega$) on the y-axis versus signal voltage (V) on the x-axis. In some embodiments, the signal voltage can represent a common mode voltage.

As shown in FIG. 5, the on-resistance 520 of the charge pump switch increases with increasing signal voltage. Specifically, in this embodiment, the on-resistance 520 of the charge pump switch increases (e.g., increases non-linearly) from approximately 30$\Omega$ to 60$\Omega$ as the signal voltage increases from approximately 0 V to 4.4 V.

On-resistance 510 of a conventional CMOS switch circuit without charge pump devices is also shown in FIG. 5. The MOSFET devices included in the conventional CMOS switch circuit can have the same characteristics (e.g., dimensions, aspect ratios, semiconductor processing) as the CMOS switch circuit included in the charge pump switch. Despite the similarities between the MOSFET devices included in the conventional CMOS switch circuit and the CMOS switch circuit included in the charge pump switch, the on-resistance 510 of the conventional CMOS switch circuit is significantly higher than the on-resistance 520 of the CMOS switch circuit of the charge pump switch. As shown in FIG. 5, at a signal voltage of approximately 4 V, the on-resistance (shown along curve 510) of the conventional CMOS switch circuit is more than 2.5 times the on-resistance (shown along curve 520) of the CMOS switch circuit included in the charge pump switch. The operation of the charge pump devices in the CMOS switch circuit of the charge pump switch can result in the relatively low on-resistance compared with the conventional CMOS switch circuit.

Figure 6:
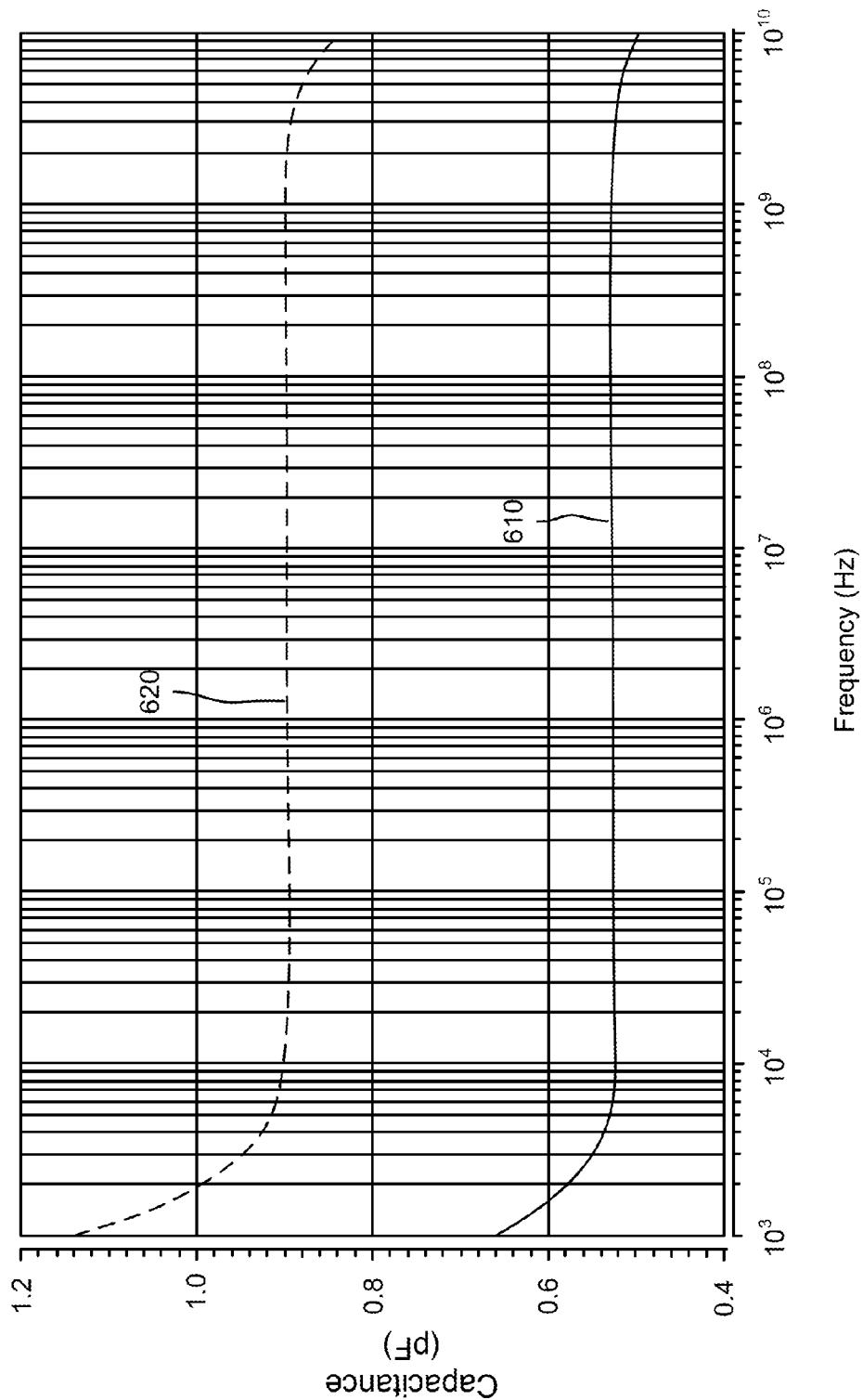
FIG. 6 is a graph that illustrates an on-capacitance for a charge pump switch including multiple charge pump devices and a CMOS switch circuit.

FIG. 6 is a graph that illustrates an on-capacitance 610 for a charge pump switch including multiple charge pump devices and a CMOS switch circuit. The charge pump switch can be the charge pump switch 200 shown in FIG. 2, and the CMOS switch circuit can be the switch circuit 210 shown in FIG. 2. As shown in FIG. 6, the on-capacitance 610 of the charge pump switch is illustrated with capacitance in pico-Farads (pF) on the y-axis versus frequency in Hertz (Hz) on the x-axis. In some embodiments, the frequency, which is varied in a frequency sweep from $10^3$ Hz to $10^{10}$ Hz, can be associated with a signal transmitted through the CMOS switch circuit. As shown in FIG. 6, the on-capacitance 610 of the charge pump switch decreases with relatively low frequencies below approximately $10^4$ Hz, is relatively flat between approximately $10^4$ Hz and $10^9$ Hz, and decreases at frequencies beyond approximately $10^9$ Hz.

On-capacitance 620 of a conventional CMOS switch circuit without charge pump devices is also shown in FIG. 6. The MOSFET devices included in the conventional CMOS switch circuit can have the same characteristics (e.g., dimensions, aspect ratios, semiconductor processing) as the CMOS switch circuit included in the charge pump switch. Despite the similarities between the MOSFET devices included in the conventional CMOS switch circuit and the CMOS switch circuit included in the charge pump switch, the on-capacitance 620 of the conventional CMOS switch circuit is significantly higher than the on-capacitance 610 of the CMOS switch circuit included in the charge pump switch.

As shown in FIG. 6, although the on-capacitance 610 of the CMOS switch circuit included in the charge pump switch has approximately the same form as the on-capacitance 620 of the conventional CMOS switch circuit, the on-capacitance 610 of the CMOS switch circuit included in the charge pump switch is consistently approximately 40% lower than the on-capacitance 620 of the conventional CMOS switch circuit. The operation of the charge pump devices in the CMOS switch circuit of the charge pump switch can result in the relatively low on-capacitance compared with the conventional CMOS switch circuit.

Figure 7:
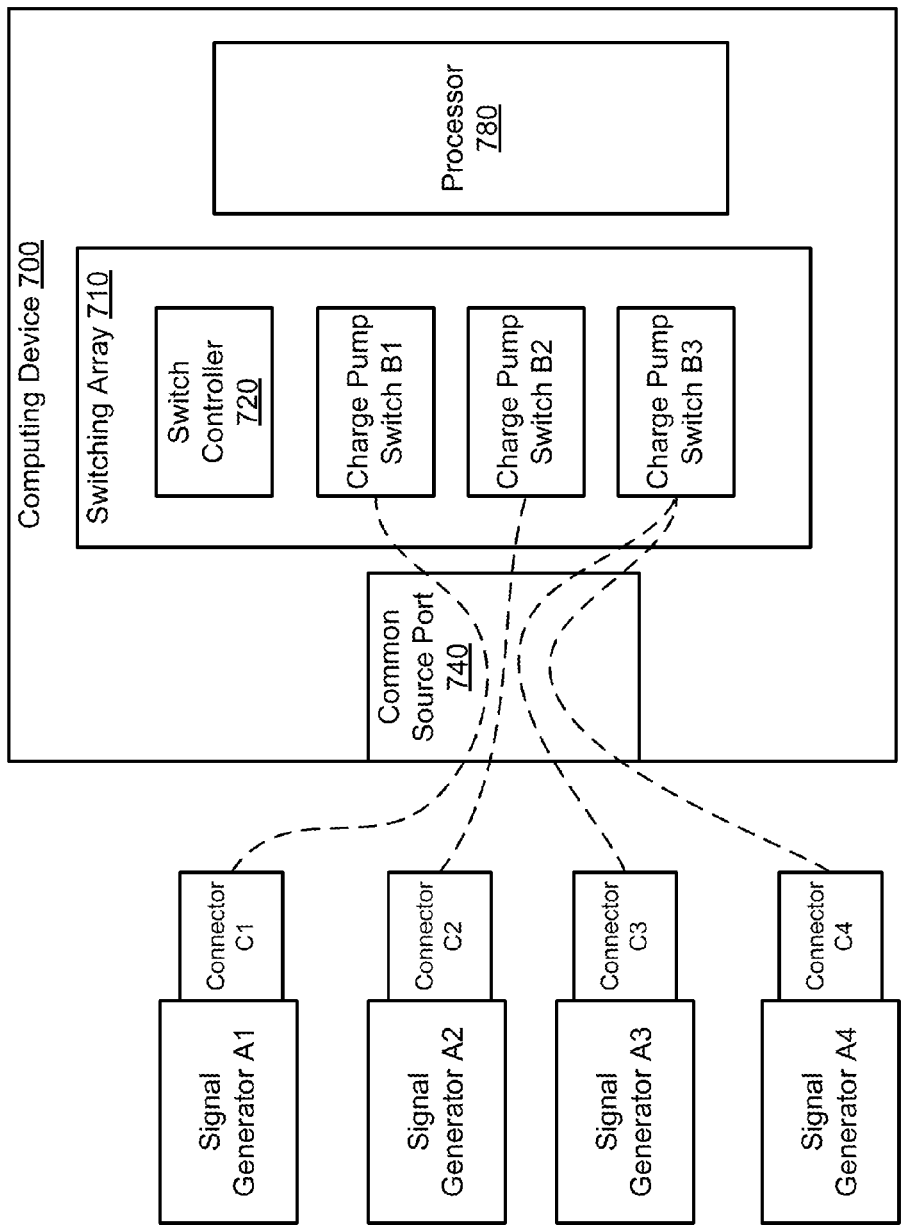
FIG. 7 is a block diagram that illustrates a computing device including a switching array, according to an embodiment.

FIG. 7 is a block diagram that illustrates a computing device 700 including a switching array 710, according to an embodiment. As shown in FIG. 7, the switching array 710 includes a switch controller 720 and charge pump switches B1 through B3. The computing device 700 also includes a common source port 740 configured to be coupled to one or more of the connectors C1 through C4. The connectors C1 through C4 are respectively associated with signal generators A1 through A4. In some embodiments, the common source port 740 can be a universal serial bus (USB) receptacle or USB port, and the connectors C1 through C4 can be USB male connectors.

As shown in FIG. 7, the signal generators A1 through A4 can be configured to send one or more signals (e.g., data signals) (illustrated with dashed lines) to one or more of the charge pump switches B1 through B3 via the common source port 740 when coupled to the common source port 740. For example, signal generator A2 can be configured to transmit one or more signals to charge pump switch B2 when the connector C2 to is coupled to (e.g., mechanically coupled to) common source port 740. In some embodiments, the connectors C1 through C4 can be coupled to the common source port 740 during concurrent or mutually exclusive time periods.

In some embodiments, one or more signals produced by the signal generators A1 through A4 can be passed through one or more of the charge pump switches B1 through B3 included in the switching array 702 for processing at the processor 780 included in the computing device 700. In some embodiments, the processor 780 can include one or more processors that can be, for example, a specialized processor (e.g., an audio signal processor, a USB signal processor, a video processor) for processing a particular signal produced by one or more signal generators A1 through A4. Accordingly, one or more of the charge pump switches B1 through B3 can be configured to function as a transmission gate switch for, for example, the computing device 700. In some embodiments, one or more of the charge pump switches B1 through B3 can be, for example, a mobile switch link, a high definition link, and/or so forth. In some embodiments, one or more of the charge pump switches B1 through B3 100 can be included in one or more data conductivity applications, data communication applications, load switch applications, and/or so forth.

In some embodiments, a signal from one or more of the signal generators A1 through A4 can be similar to the data signal 12 described in connection with FIG. 1. For example, the signal can be a video signal, an audio signal, a control signal, and/or so forth. In some embodiments, one or more of the signals can be a differential signal, a high-frequency signal, a low-frequency signal, a multiplexed signal, an analog signal, a digital signal, and/or so forth.

In some embodiments, the computing device 700 (similar to that discussed in connection with FIG. 1) can be, for example, a wired device and/or a wireless device (e.g., a wi-fi enabled device) and can be, for example, a computing entity (e.g., a personal computing device), a server device (e.g., a web server), a mobile phone, a touchscreen device, a personal digital assistant (PDA), a laptop, a television including, or associated with, one or more processors, a tablet device, e-reader, and/or so forth. The computing device 700 can be configured to operate based on one or more platforms (e.g., one or more similar or different platforms) that can include one or more types of hardware, software, firmware, operating systems, runtime libraries, and/or so forth.

The switch controller 720 can be configured to enable or disable one or more of the charge pump switches B1 through B3 using one or more switch control signals. In some embodiments, switch controller 720 can be configured to disable charge pump switches that are inactive (or scheduled to be inactive) and/or enable charge pump switches that are active (or scheduled to be active). In some embodiments, switch controller 720 can be configured to disable charge pump switches and/or enable charge pump switches based on which of the signal generators A1 through A4 is connected to the common source port 740.

For example, charge pump switch B1 can be configured to pass a signal from signal generator A1 to the processor 780 via the common source port 740. Accordingly, when the signal generator A1 is coupled to the common source port 740 using connector C1, the switch controller 720 can be configured to enable charge pump switch B1 and disable the remaining charge pump switches (i.e., charge pump switch B2 and charge pump switch B3). The charge pump switch B1 can define a low impedance path through which signals produced by the signal generator A1 can pass, and the remaining charge pump switches can be in a high impedance or blocking state.

Although FIG. 7 illustrates that the computing device 700 includes charge pump switches B1 through B3, in some embodiments, one or more of the signal generators A1 through A4, which also can be included in one or more computing devices can include one or more charge pump switches. Signaling (or communication) between the computing device 700 and one or more computing devices including one or more of the signal generators A1 through A4 can be bidirectional. In such instances, the processor 780, or a portion thereof, can also function as a signal generator.

In some embodiments, one or more of the charge pump switches B1 through B3 can operate using the same or different positive or negative charge pump devices. For example, charge pump switch B1 and charge pump switches B2 can operate using the same negative charge pump device, but different positive charge pump devices (or vice versa). As another example, a positive charge pump voltage for charge pump switch B1 can be different than a positive charge pump voltage for charge pump switch B2. Similarly, a negative charge pump voltage for charge pump switch B1 can be different than a negative charge pump voltage for charge pump switch B2.

Figure 8A:
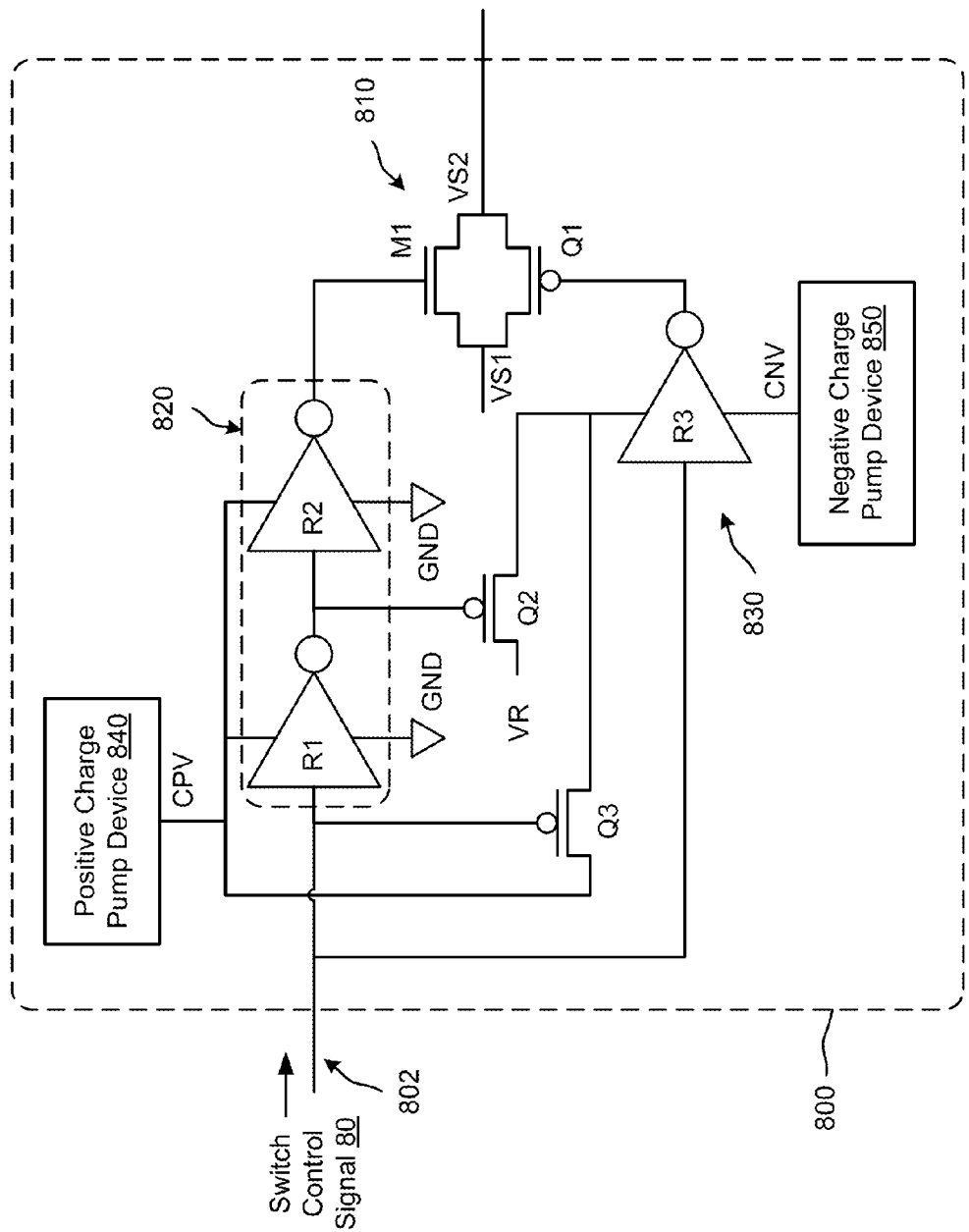
FIGS. 8A and 8B are schematic diagrams that illustrate additional implementation of a charge pump switch, according to an embodiment.

FIG. 8A is a schematic diagram that illustrates another implementation of a charge pump switch 800, according to an embodiment. In some embodiments, the charge pump switch 800 can be an implementation of the charge pump switch 100 shown in FIG. 1. Many of the features included in the charge pump switch 800 are similar to, or the same as, the features included in the charge pump switches above (e.g., charge pump switch 200 shown in FIG. 2). Accordingly, discussion associated with the charge pump switches above can apply to the charge pump switch 800 shown in this figure.

As shown in FIG. 8A, the charge pump switch 800 includes a positive charge pump device 840 coupled to inverters R1 and R2 functioning as a first driver circuit 820 for an NMOS device M1 included in a switch circuit 810. The charge pump switch 800 also includes a negative charge pump device 850 coupled to (e.g., coupled to a low side of) inverter R3 functioning as a second driver circuit 830 for a PMOS device P1 included in the switch circuit 810. As shown in FIG. 8A, the NMOS device N1 and the PMOS device P1 of the switch circuit 810 collectively define a complementary MOSFET (CMOS) device.

The charge pump switch 800 is configured to receive a switch control signal 80 at an input terminal 802 of the charge pump switch 800. In this embodiment, the switch control signal 80 can have a high enable value that enables (e.g., turns on) the charge pump switch 800 and a low disable value to disable (e.g., turns off) the charge pump switch 800.

In some embodiments, the positive charge pump device 840 and the negative charge pump device 850 can collectively be referred to as charge pump devices 840, 850. The positive charge pump device 840 is configured to produce a positive charge pump voltage CPV, and the negative charge pump device 840 is configured to produce a negative charge pump voltage CNV.

As shown in FIG. 8A, the switch circuit 810 can function as a pass gate (e.g., a pass-through gate). An input signal (e.g., input data signal) VS1 can be received on one side of the switch circuit 810 and can be transmitted from the switch circuit 810 as output signal VS2 (when the switch circuit 810 is turned on). When the switch circuit 810 is off, the input signal VS1 can be blocked or prevented (e.g., substantially blocked or prevented) from passing through the switch circuit 810.

The inverters R1, R2 (which collectively function as the first driver circuit 820), as shown in FIG. 8A, are coupled to a ground voltage GND. The inverter R3 (which functions as the second driver circuit 830) is coupled to either the positive charge pump voltage CPV via PMOS device Q3 or a voltage VR via PMOS device Q2. The PMOS device Q3 is controlled by a switch control signal 80, and the PMOS device Q2 is controlled by the inverted signal (of the switch control signal 80) produced by inverter R1. In some embodiments, the voltage VR can be a regulation voltage, which can be between the positive charge pump voltage CPV and the negative charge pump voltage CNV. In some embodiments, the voltage VR can be greater than or lower than a battery voltage (not shown) or greater than the ground voltage GND.

When the switch control signal 80 is a high value, which in this embodiment enables the charge pump switch 800, the NMOS device M1 is activated (e.g., turned-on) via the first driver circuit 820 and the PMOS device Q1 is activated (e.g., turned-on) via the second driver circuit 830. The negative charge pump voltage CNV is applied to the PMOS device Q1 via the inverter R3 (i.e., the second driver circuit 830). Also, the PMOS device Q2 is activated so that the voltage VR is applied to the inverter R3, and the PMOS device Q3 is deactivated so that the charge pump voltage CPV is not applied to the inverter R3.

When the switch control signal 80 is a low value, which in this embodiment disables the charge pump switch 800, the NMOS device M1 is deactivated (e.g., turned-off) via the first driver circuit 820 and the PMOS device Q1 is deactivated (e.g., turned-off) via the second driver circuit 830 (i.e., inverter R3). Also, the PMOS device Q2 is deactivated so that the voltage VR is not applied to PMOS device Q1 via the inverter R3. Instead, the PMOS device Q3 is activated so that the positive charge pump voltage CPV is applied to PMOS device Q1 via the inverter R3. The positive charge pump voltage CPV can, in some embodiments, be the highest voltage in a computing device, which includes the charge pump switch 800, so that the PMOS device Q1 is completely turned-off and may have a relatively low leakage current.

As illustrated by this example, when the charge pump switch 800 is enabled, the negative charge pump voltage CNV is applied to the PMOS device Q1 to turn-on the PMOS device Q1, and when the charge pump switch 800 is disabled, the charge pump voltage CPV is applied to the PMOS device Q1 to turn-off the PMOS device Q1. The PMOS devices Q2, Q3 control the voltage applied (e.g., applied via the second driver circuit 830) to turn-off the PMOS device Q1. Accordingly, the PMOS devices Q2, Q3 can be referred to as turn-off voltage control devices. In some embodiments, the turn-off voltage control devices can include devices in addition to, or in lieu of, the PMOS devices Q2, Q3. The voltage applied to the PMOS device Q1 can be referred to as a turn-off voltage.

In the event that the charge pump switch 800 is not active, the PMOS device Q1 can continue to be disabled (as illustrated by this circuit) using another voltage separate from the positive charge pump voltage CPV. The voltage used to continue to disable the PMOS device Q1 can be provided via a voltage selector. A variation of the charge pump switch 800 shown in FIG. 8A that includes a voltage selector is shown in FIG. 8B.

Figure 8B:
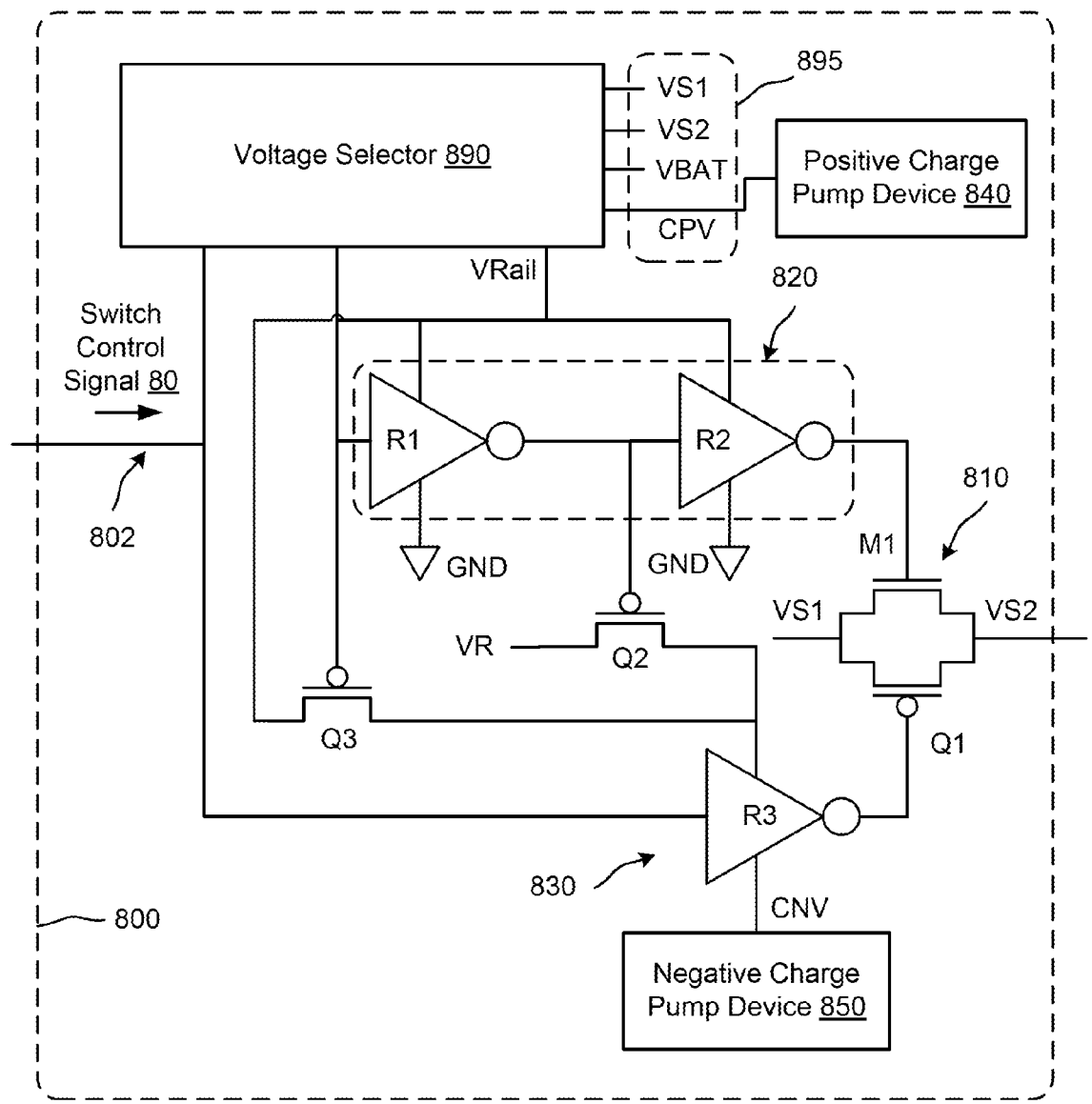

As shown in FIG. 8B, the charge pump switch 800 includes a voltage selector 890. When the switch control signal 80 is a high value, which in this embodiment enables the charge pump switch 800, the PMOS device Q1 is activated (e.g., turned-on) via the second driver circuit 830. The negative charge pump voltage CNV is applied by the negative charge pump device 850 to the PMOS device Q1. Also, when the switch control signal 80 is the high value, the voltage selector 890 is configured to produce a voltage VRail that is based on (e.g., equal to) the positive charge pump voltage CPV. The positive charge pump voltage CPV activates the first driver circuit 820 and causes the first driver circuit 820 to activate the NMOS device M1 (using the positive charge pump voltage CPV). PMOS device Q2 is activated (by the inverted output signal of inverter R1), and PMOS device Q3 is deactivated, so that the voltage VR (which can be a regulation voltage) is applied to the inverter R3.

When the switch control signal 80 is a low value, which in this embodiment disables the charge pump switch 800, the voltage selector 890 is configured to produce the voltage VRail based on the highest of VS1, VS2, a battery voltage VBAT, and the positive charge pump voltage CPV (which can be referred to as a set of voltages 895). The voltage selector 890 is configured to deactivate the NMOS device M1 via the first driver circuit 820. PMOS device Q2 is deactivated (by the inverted output signal of inverter R1) so that voltage VRail (which is the highest of VS1, VS2, the battery voltage VBAT, and the positive charge pump voltage CPV) is applied to PMOS device Q1 via the inverter R3 (i.e., the second driver circuit 830). In the event that the charge pump switch 800 is disabled when the charge pump switch 800 is disabled, the voltage VRail will be provided by the highest available voltage from VS1, VS2, and VBAT to maintain the PMOS device Q1 in an inactive (e.g., off-state). Similar to the embodiment shown in FIG. 8A, the PMOS devices Q2, Q3 also selectively control the voltage applied (e.g., applied via the second driver circuit 830) to turn-off the PMOS device Q1 based on the state (as disabled or enabled) of the charge pump switch 800. In some embodiments, the voltage selector 890 can be configured to select a voltage to apply to voltage VRail from a different set of voltages (e.g., more voltages, less voltages) than shown in FIG. 8B.

In one general aspect, an apparatus can include a complementary switch circuit including a first portion and a second portion, and a first driver circuit coupled to the first portion of the complementary switch circuit. The apparatus can include a positive charge pump device coupled to the first driver, and a second driver circuit coupled to the second portion of the complementary switch circuit. The apparatus can also include a negative charge pump device coupled to the second driver circuit.

In some embodiments, the first driver circuit is configured to provide a range of voltages overlapping with a range of voltages provided by the second driver circuit. The range of voltages provided by the first driver circuit can include a positive charge pump voltage produced by the positive charge pump device. The range of voltages provided by the second driver circuit can include a negative charge pump voltage produced by the negative charge pump device.

In some embodiments, the complementary switch circuit is a transmission gate switch configured to pass a signal produced by a signal generator when the complementary switch is activated, and configured to block the signal produced by the signal generator when the complementary switch is deactivated. In some embodiments, the first driver circuit includes at least one inverter, and the second driver circuit includes at least two inverters. In some embodiments, the second driver circuit is coupled to a regulation voltage, and the positive charge pump device is configured to produce a voltage greater than the regulation voltage.

In some embodiments, the positive charge pump device is configured to apply a positive charge pump voltage higher than a regulation voltage to the first portion of the complementary switch circuit via the first driver circuit. In some embodiments, the negative charge pump device is configured to apply a negative charge pump voltage lower than a ground voltage to the second portion of the complementary switch circuit via the second driver circuit. In some embodiments, the complementary switch circuit is a first complementary switch circuit included in a switching array including a second complementary switch circuit in parallel to the first complementary switch circuit. In some embodiments, the complementary switch circuit includes a complementary metal-oxide-semiconductor field-effect transistor (CMOS) device. In some embodiments, the apparatus can include a voltage selector configured to provide a voltage selected from a set of voltages to the second portion of the complementary switch circuit via the second driver circuit.

In another general aspect an apparatus can include a positive charge pump device, and a negative charge pump device. The apparatus can include a transmission gate switch including an N-type metal-oxide-semiconductor field-effect transistor (MOSFET) device operatively coupled to the positive charge pump device via a first driver circuit, and a P-type MOSFET device operatively coupled to the negative charge pump via a second driver circuit.

In some embodiments, the first driver circuit is configured to provide a range of voltages higher than a range of voltages provided by the second driver circuit. In some embodiments, the second driver circuit is coupled to a regulation voltage lower than the positive charge pump voltage and lower than a battery voltage. The first driver circuit can be coupled to a ground voltage higher than the negative charge pump voltage.

In some embodiments, the apparatus can include a plurality of turn-off voltage control devices configured to selectively provide a turn-off voltage to the P-type MOSFET device based on the transmission gate switch being activated or deactivated. In some embodiments, the P-type MOSFET device is a first P-type MOSFET device, and the apparatus can include a second P-type MOSFET device configured to provide a voltage selected from a set of voltages to the first P-type MOSFET device when the transmission gate switch is disabled. The set of voltages can include more than two voltages and including the positive charge pump voltage.

In some embodiments, the transmission gate switch functions as a signal pass through device. In some embodiments, the second driver circuit is configured to provide a regulation voltage to the P-type MOSFET device to deactivate the transmission gate switch. The positive charge pump voltage can have a magnitude more than 1.5 times a magnitude of the regulation voltage.

In yet another general aspect, a method can include receiving a switch enable signal at an input terminal of a charge pump switch, and applying a positive charge pump voltage higher than a regulation voltage to a first portion of a switch circuit included in the charge pump switch in response to the receiving the switch enable signal. The method can include applying a negative charge pump voltage lower than a ground voltage to a second portion of the switch circuit included in the charge pump switch in response to the receiving the switch enable signal.

In some embodiments, the method can include maintaining, in response to the receiving the switch disable signal, the second portion of the switch circuit in an off-state using a voltage selected from a set of voltages including the positive charge pump voltage, a battery voltage, and a signal voltage. In some embodiments, the method can include receiving a switch disable signal at the input terminal of the charge pump switch, and applying the charge pump voltage to the second portion of the switch circuit in response to the receiving the switch disable signal. The method can also include applying the ground voltage to the first portion of the switch circuit in response to the receiving the switch disable signal.

In some embodiments, the method can include receiving a switch disable signal at the input terminal of the charge pump switch, and applying a rail voltage to the second portion of the switch circuit in response to the receiving the switch disable signal and in response to a charge pump device producing the charge pump voltage being deactivated where the rail voltage is selected from a plurality of voltages. The method can also include applying the ground voltage to the first portion of the switch circuit in response to the receiving the switch disable signal.

Implementations of the various techniques described herein may be implemented in digital electronic circuitry, or in computer hardware, firmware, software, or in combinations of them. Implementations may be implemented as a computer program product (e.g., a computer program tangibly embodied in an information carrier, a machine-readable storage device, a computer-readable medium, a tangible computer-readable medium), for processing by, or to control the operation of, data processing apparatus (e.g., a programmable processor, a computer, or multiple computers). In some implementations, a tangible computer-readable storage medium can be configured to store instructions that when executed cause a processor to perform a process. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry (e.g., an FPGA (field programmable gate array) or an ASIC (application-specific integrated circuit)).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data (e.g., magnetic, magneto-optical disks, or optical disks). Information carriers suitable for embodying computer program instructions and data include all forms of non-volatile memory, including by way of example semiconductor memory devices (e.g., EPROM, EEPROM, and flash memory devices); magnetic disks (e.g., internal hard disks or removable disks); magneto-optical disks; and CD-ROM and DVD-ROM disks. The processor and the memory may be supplemented by, or incorporated in special purpose logic circuitry.

Implementations may be implemented in a computing system that includes a back-end component (e.g., as a data server), or that includes a middleware component (e.g., an application server), or that includes a front-end component (e.g., a client computer having a graphical user interface or a Web browser) through which a user can interact with an implementation, or any combination of such back-end, middleware, or front-end components. Components may be interconnected by any form or medium of digital data communication (e.g., a communication network). Examples of communication networks include a local area network (LAN) and a wide area network (WAN) (e.g., the Internet).

Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Germanium (SiGe), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a complementary switch circuit including a first portion and a second portion;
a first driver circuit coupled to the first portion of the complementary switch circuit;
a positive charge pump device configured to produce a positive charge pump voltage and coupled to the first driver, the first driver including a ground terminal configured to receive a ground voltage;
a second driver circuit coupled to the second portion of the complementary switch circuit; and
a negative charge pump device configured to produce a negative charge pump voltage and coupled to the second driver circuit, the negative charge pump voltage being lower than the ground voltage, the second driver circuit including a regulation terminal configured to receive a regulation voltage lower than the positive charge pump voltage, the regulation voltage being different than the ground voltage.

2. The apparatus of claim 1, wherein the first driver circuit is configured to provide a range of voltages overlapping with at least a portion of a range of voltages provided by the second driver circuit, the range of voltages provided by the first driver circuit includes the positive charge pump voltage produced by the positive charge pump device and includes the ground voltage, the range of voltages provided by the second driver circuit includes the negative charge pump voltage produced by the negative charge pump device and includes the regulation voltage.

3. The apparatus of claim 1, wherein the complementary switch circuit is a transmission gate switch configured to pass a signal produced by a signal generator when the complementary switch is activated, and configured to block the signal produced by the signal generator when the complementary switch is deactivated.

4. The apparatus of claim 1, wherein the first driver circuit includes at least one inverter, and the second driver circuit includes at least two inverters.

5. The apparatus of claim 1, wherein the positive charge pump device is configured to apply the positive charge pump voltage to the first portion of the complementary switch circuit via the first driver circuit.

6. The apparatus of claim 1, wherein the negative charge pump device is configured to apply the negative charge pump voltage to the second portion of the complementary switch circuit via the second driver circuit.

7. The apparatus of claim 1, wherein the complementary switch circuit is a first complementary switch circuit included in a switching array including a second complementary switch circuit in parallel to the first complementary switch circuit.

8. The apparatus of claim 1, wherein the complementary switch circuit includes a complementary metal-oxide-semiconductor field-effect transistor (CMOS) device.

9. The apparatus of claim 1, further comprising:
a voltage selector configured to provide a voltage selected from a set of voltages to the second portion of the complementary switch circuit via the second driver circuit, the positive charge pump device is coupled to the second driver circuit via the voltage selector.

10. The apparatus of claim 1, wherein the regulation voltage is lower than a battery voltage.

11. The apparatus of claim 1, wherein the second driver circuit is configured to provide the regulation voltage to the second portion of the complementary switch circuit to deactivate the complementary switch circuit, the positive charge pump voltage has a magnitude more than 1.5 times a magnitude of the regulation voltage.

12. The apparatus of claim 1, further comprising:
a voltage selector configured to provide a voltage selected from a set of voltages to the second portion of the complementary switch circuit via the second driver circuit, the set of voltages including the positive charge pump voltage produced by the positive charge pump device, a battery voltage, and at least one signal voltage.

13. An apparatus, comprising:
a positive charge pump device configured to produce a positive charge pump voltage;
a negative charge pump device configured to produce a negative charge pump voltage;
a first driver circuit including a ground terminal configured to receive a ground voltage higher than the negative charge pump voltage, the first driver circuit configured to provide a range of voltages including the positive charge pump voltage and the ground voltage;
a second driver circuit;
a transmission gate switch including an N-type metal-oxide-semiconductor field-effect transistor (MOSFET) device operatively coupled to the positive charge pump device via the first driver circuit, and a P-type MOSFET device operatively coupled to the negative charge pump device via the second driver circuit; and
a voltage control device configured to selectively provide the positive charge pump voltage to the second driver circuit.

14. The apparatus of claim 13, wherein the range of voltages provided by the first driver circuit is higher than a range of voltages provided by the second driver circuit, the range of voltages provided by the second driver circuit includes the negative charge pump voltage.

15. The apparatus of claim 13, further comprising:
a plurality of voltage control devices including the voltage control device, and configured to selectively provide the positive charge pump voltage to the P-type MOSFET device based on the transmission gate switch being activated or deactivated.

16. The apparatus of claim 13, wherein the P-type MOSFET device is a first P-type MOSFET device, the voltage control device is a second P-type MOSFET device configured to provide a voltage within the range of voltages to the first P-type MOSFET device when the transmission gate switch is disabled, the range of voltages including more than two voltages and including the positive charge pump voltage.

17. The apparatus of claim 13, wherein the transmission gate switch functions as a signal pass through device.

18. A method, comprising:
receiving a switch enable signal at an input terminal of a charge pump switch;
receiving a regulation voltage;
applying, in response to the receiving the switch enable signal, a positive charge pump voltage higher than the regulation voltage to a first portion of a switch circuit included in the charge pump switch;
receiving a ground voltage different than the regulation voltage; and applying, in response to the receiving the switch enable signal, a negative charge pump voltage lower than the ground voltage to a second portion of the switch circuit included in the charge pump switch.

19. The method of claim 18, further comprising:

maintaining, in response to the receiving the switch disable signal, the second portion of the switch circuit in an off-state using a voltage selected from a set of voltages including the positive charge pump voltage, a battery voltage, and a signal voltage.

20. The method of claim 18, further comprising:

receiving a switch disable signal at the input terminal of the charge pump switch;

applying the charge pump voltage to the second portion of the switch circuit in response to the receiving the switch disable signal; and applying the ground voltage to the first portion of the switch circuit in response to the receiving the switch disable signal.

21. The method of claim 18, further comprising:

receiving a switch disable signal at the input terminal of the charge pump switch;

applying a rail voltage to the second portion of the switch circuit in response to the receiving the switch disable signal and in response to a charge pump device producing the charge pump voltage being deactivated, the rail voltage being selected from a plurality of voltages; and applying the ground voltage to the first portion of the switch circuit in response to the receiving the switch disable signal.

* * * * *